United States Patent
Yu

(10) Patent No.: US 10,153,462 B2
(45) Date of Patent: Dec. 11, 2018

(54) MANUFACTURING METHOD OF FLEXIBLE OLED DISPLAY PANEL

(71) Applicant: Wuhan China Star Optoelectronics Technology Co., Ltd., Wuhan (CN)

(72) Inventor: Wei Yu, Wuhan (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 89 days.

(21) Appl. No.: 15/505,100

(22) PCT Filed: Dec. 28, 2016

(86) PCT No.: PCT/CN2016/112532
§ 371 (c)(1),
(2) Date: Feb. 20, 2017

(87) PCT Pub. No.: WO2018/113006
PCT Pub. Date: Jun. 28, 2018

(65) Prior Publication Data
US 2018/0198094 A1    Jul. 12, 2018

(30) Foreign Application Priority Data

Dec. 20, 2016  (CN) .......................... 2016 1 1185420

(51) Int. Cl.
*H01L 21/00* (2006.01)
*H01L 51/56* (2006.01)
(Continued)

(52) U.S. Cl.
CPC .......... *H01L 51/56* (2013.01); *H01L 27/3244* (2013.01); *H01L 51/003* (2013.01);
(Continued)

(58) Field of Classification Search
CPC ................ H01L 51/56; H01L 51/0005; H01L 51/0097; H01L 51/0004; H01L 2251/5338
See application file for complete search history.

(56) References Cited

U.S. PATENT DOCUMENTS 8,389,323 B2 * 3/2013 Choi ................. H01L 21/268
257/E51.022
2003/0207500 A1 * 11/2003 Pichler ................ H01L 51/5253
438/127
(Continued)

FOREIGN PATENT DOCUMENTS

CN          1629905 A     6/2005

*Primary Examiner* — Jaehwan Oh
*Assistant Examiner* — John M Parker
(74) *Attorney, Agent, or Firm* — Leong C. Lei

(57) ABSTRACT

The present invention provides a manufacturing method of a flexible OLED display panel, in which multiple loops of inorganic barrier walls are first formed on a rigid base plate such that the multiple loops of inorganic barrier walls respectively and circumferentially encloses a plurality of panel areas on the rigid base plate so that when an organic material film is then coated on the rigid base plate and the multiple loops of inorganic barrier walls in a manner of covering the entirety of surface thereof, the multiple loops of inorganic barrier walls provide an effect of division to allow a plurality of flexible backings to be respectively formed on the plurality of panel areas of the rigid base plate. Afterwards, a laser lift off technique is applied to remove the plurality of flexible backings from the rigid base plate to thus obtain a plurality of flexible OLED display panels. Compared to the prior art, the present invention saves a process of using a laser cutting machine to simultaneously cut the organic material film and the rigid base plate and thus saves the cost of purchasing the laser cutting machine and also save one round of laser cutting operation to thereby reduce the manufacturing cost of a flexible OLED display panel.

18 Claims, 5 Drawing Sheets

(51) Int. Cl.
*H01L 51/00* (2006.01)
*H01L 51/52* (2006.01)
*H01L 27/32* (2006.01)

(52) U.S. Cl.
CPC ........ *H01L 51/004* (2013.01); *H01L 51/0035* (2013.01); *H01L 51/0094* (2013.01); *H01L 51/0097* (2013.01); *H01L 51/5256* (2013.01); H01L 2227/323 (2013.01); H01L 2227/326 (2013.01); H01L 2251/301 (2013.01); H01L 2251/303 (2013.01); H01L 2251/5338 (2013.01); H01L 2251/558 (2013.01); H01L 2251/566 (2013.01)

(56) References Cited

U.S. PATENT DOCUMENTS

| | | | | |
|---|---|---|---|---|
| 2004/0207800 | A1* | 10/2004 | Hiruma | G02F 1/1341 349/189 |
| 2005/0020175 | A1* | 1/2005 | Tamashiro | H01L 27/3293 445/24 |
| 2005/0057717 | A1* | 3/2005 | Rho | G02F 1/133305 349/158 |
| 2005/0100658 | A1* | 5/2005 | MacPherson | H01L 51/0004 427/58 |
| 2007/0148333 | A1* | 6/2007 | Morimoto | H01L 51/5048 427/66 |
| 2007/0148815 | A1* | 6/2007 | Chao | B08B 17/06 438/104 |
| 2007/0160772 | A1* | 7/2007 | Morimoto | H01L 51/0005 427/466 |
| 2014/0342482 | A1* | 11/2014 | Morimoto | H01L 51/0005 438/34 |
| 2018/0123085 | A1* | 5/2018 | Kakishita | B32B 3/02 |

* cited by examiner

MANUFACTURING METHOD OF FLEXIBLE OLED DISPLAY PANEL

BACKGROUND OF THE INVENTION

1. Field of the Invention

The present invention relates to the field of display technology, and more particular to a manufacturing method of a flexible OLED display panel.

2. The Related Arts

Organic light-emitting display (OLED) possesses various advantages, such as being self-luminous, low drive voltage, high luminous efficiency, short response time, high clarity and contrast, almost 180° view angle, wide range of operation temperature, and easy realization of flexible displaying and large-area full-color displaying, and is considered the most promising display device in the industry.

Based on the way of driving, OLEDs can be classified in two categories, passive matrix OLED (PMOLED) and active matrix OLED (AMOLED), namely two categories of direct addressing and TFT array addressing, among which the AMOLED comprises pixels that are arranged in an array and belongs to an active display type, having high light emission performance and being commonly used in high definition large-sized display devices.

An OLED is generally made up of a substrate, an anode arranged on the substrate, a hole injection layer arranged on and anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carrier currents are injected and re-combine to cause emission of light. Specifically, the OLED display device often uses an indium tin oxide (ITO) electrode and a metal electrode to respectively serve as anode and cathode of the device and electrons and holes, when driven by a predetermined electrical voltage, are respectively injected into the electron transport layer and the hole transport layer from the cathode and the anode such that the electrons and the holes respectively migrate through the electron transport layer and the hole transport layer to get into the emissive layer and meet in the emissive layer to form excitons to excite light emissive molecules to emit light, the later undergoing radiation relaxation to give off visible light.

Flat panel displaying and lighting associated with OLED recently attract wide attention of the scientific research and academic community. Particularly, in the recent years, flexible OLED display panels that exhibit wide future prosperity are now emerging and become the focus of competition among the major panel manufacturers.

A mainstream manufacturing method of the flexible OLED display panels is as follows. With a glass plate as a carrier, a layer of polyimide (PI) film is coated on an entire surface of the glass plate and the PI film is cured so that PI film may serve as a flexible substrate. Then, a water/oxygen barrier layer is formed on the cured PI film and a thin-film transistor (TFT) layer, an OLED device layer, and a thin-film package layer are formed in sequence on the water/oxygen barrier layer so as to a parent flexible OLED display board. Cutting is then applied to make the parent flexible OLED display board into various flexible OLED display panels. Since the PI film is attached to the entire surface of the glass plate, it is not possible to use a conventionally employed wheel cutter to perform the cutting operation and a laser cutting machine, which is expensive, must be used to achieve simultaneous cutting through the glass plate and the PI film. After the cutting, a laser lift off (LLO) machine is used to separate the PI film from the glass plate in order to obtain the flexible OLED display panels. However, the above-described manufacturing process requires the use of laser cutting machines, which are expensive, and also involves strict control of energy homogeneity, so that the manufacturing cost is increased.

SUMMARY OF THE INVENTION

An objective of the present invention is to provide a manufacturing method of a flexible OLED display panel, which saves the cost of purchasing a laser cutting machine and also saves one round of laser cutting process so as to reduce the manufacturing costs of the flexible OLED display panel.

To achieve the above objective, the present invention provides a manufacturing method of an OLED display panel, which comprises the following steps:

Step 1: providing a rigid base plate and forming multiple loops of inorganic barrier walls, which are spaced from each other, on the rigid base plate such that the multiple loops of inorganic barrier walls respectively and circumferentially enclose a plurality of panel areas on the rigid base plate;

Step 2: coating an organic material film on the rigid base plate and the multiple loops of inorganic barrier walls, in a manner of covering the entirety of surface thereof, such that as being separated by the multiple loops of inorganic barrier walls, portions of the organic material film that are located on the plurality of panel areas of the rigid base plate respectively form a plurality of flexible backings;

Step 3: forming a plurality of water/oxygen barrier layers respectively on the plurality of flexible backings, forming, in sequence from bottom to top, thin-film transistor layers and OLED device layers respectively on the plurality of water/oxygen barrier layers, and applying packaging to the thin-film transistor layers and the OLED device layers to form a plurality of thin-film packaging layers respectively on the OLED device layers and the water/oxygen barrier layers such that each of the thin-film packaging layers encloses the OLED device layer and the thin-film transistor layer located thereunder to thereby form a plurality of flexible OLED display panels, which are respectively located in the multiple loops of inorganic barrier walls, on the rigid base plate; and Step 4: applying laser lift off (LLO) technology to remove the plurality of flexible backings from the rigid base plate so as to obtain a plurality of flexible OLED display panels.

The rigid base plate comprises a glass plate.

The multiple loops of inorganic barrier walls are formed of a material comprising at least one of silicon oxide, silicon nitride, and silicon oxynitride.

The material of the multiple loops of inorganic barrier walls is silicon oxide, and the multiple loops of inorganic barrier walls are formed with a process including: providing frit, wherein the frit comprises silicon oxide and a solvent, and applying screen printing to coat multiple loops of frit on the rigid base plate, followed by heating and curing to form the multiple loops of inorganic barrier walls.

In Step 2, the organic material film comprises a polyimide film.

The flexible backings have a thickness that is less than a height of the inorganic barrier walls.

The water/oxygen barrier layers each have a surface area that is smaller than or substantially equal to a surface area of the flexible backings and also greater than a surface area of the OLED device layers and the thin-film transistor layers.

The water/oxygen barrier layers and the thin-film packaging layers each comprise a plurality of inorganic material layers and organic material layers arranged to stack on and alternate with each other.

The inorganic material layers are formed of a material comprising at least one of silicon oxide, silicon nitride, and silicon oxynitride; and the organic material layers are formed of a material comprising one or multiple ones of acrylic, hexamethyldisiloxane, polyacrylate, polycarbonate, and polystyrene.

The flexible OLED display panels each comprise: the flexible backing; the water/oxygen barrier layer, the thin-film transistor layer, and the OLED device layer that are stacked, in sequence from bottom to top, on the flexible backing; and a thin-film packaging layer arranged on the OLED device layer and the water/oxygen barrier layer, wherein the thin-film packaging layer encloses the OLED device layer and the thin-film transistor layer located thereunder.

The present invention also provides a manufacturing method of an OLED display panel, which comprises the following steps:

Step 1: providing a rigid base plate and forming multiple loops of inorganic barrier walls, which are spaced from each other, on the rigid base plate such that the multiple loops of inorganic barrier walls respectively and circumferentially enclose a plurality of panel areas on the rigid base plate;

Step 2: coating an organic material film on the rigid base plate and the multiple loops of inorganic barrier walls, in a manner of covering the entirety of surface thereof, such that as being separated by the multiple loops of inorganic barrier walls, portions of the organic material film that are located on the plurality of panel areas of the rigid base plate respectively form a plurality of flexible backings;

Step 3: forming a plurality of water/oxygen barrier layers respectively on the plurality of flexible backings, forming, in sequence from bottom to top, thin-film transistor layers and OLED device layers respectively on the plurality of water/oxygen barrier layers, and applying packaging to the thin-film transistor layers and the OLED device layers to form a plurality of thin-film packaging layers respectively on the OLED device layers and the water/oxygen barrier layers such that each of the thin-film packaging layers encloses the OLED device layer and the thin-film transistor layer located thereunder to thereby form a plurality of flexible OLED display panels, which are respectively located in the multiple loops of inorganic barrier walls, on the rigid base plate; and Step 4: applying laser lift off technology to remove the plurality of flexible backings from the rigid base plate so as to obtain a plurality of flexible OLED display panels;

wherein the rigid base plate comprises a glass plate; and wherein in Step 2, the organic material film comprises a polyimide film.

The efficacy of the present invention is that the present invention provides a manufacturing method of a flexible OLED display panel, in which multiple loops of inorganic barrier walls are first formed on a rigid base plate such that the multiple loops of inorganic barrier walls respectively and circumferentially encloses a plurality of panel areas on the rigid base plate so that when an organic material film is then coated on the rigid base plate and the multiple loops of inorganic barrier walls in a manner of covering the entirety of surface thereof, the multiple loops of inorganic barrier walls provide an effect of division to allow a plurality of flexible backings to be respectively formed on the plurality of panel areas of the rigid base plate. Afterwards, a laser lift off technique is applied to remove the plurality of flexible backings from the rigid base plate to thus obtain a plurality of flexible OLED display panels. Compared to the prior art, the present invention saves a process of using a laser cutting machine to simultaneously cut the organic material film and the rigid base plate and thus saves the cost of purchasing the laser cutting machine and also save one round of laser cutting operation to thereby reduce the manufacturing cost of a flexible OLED display panel.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
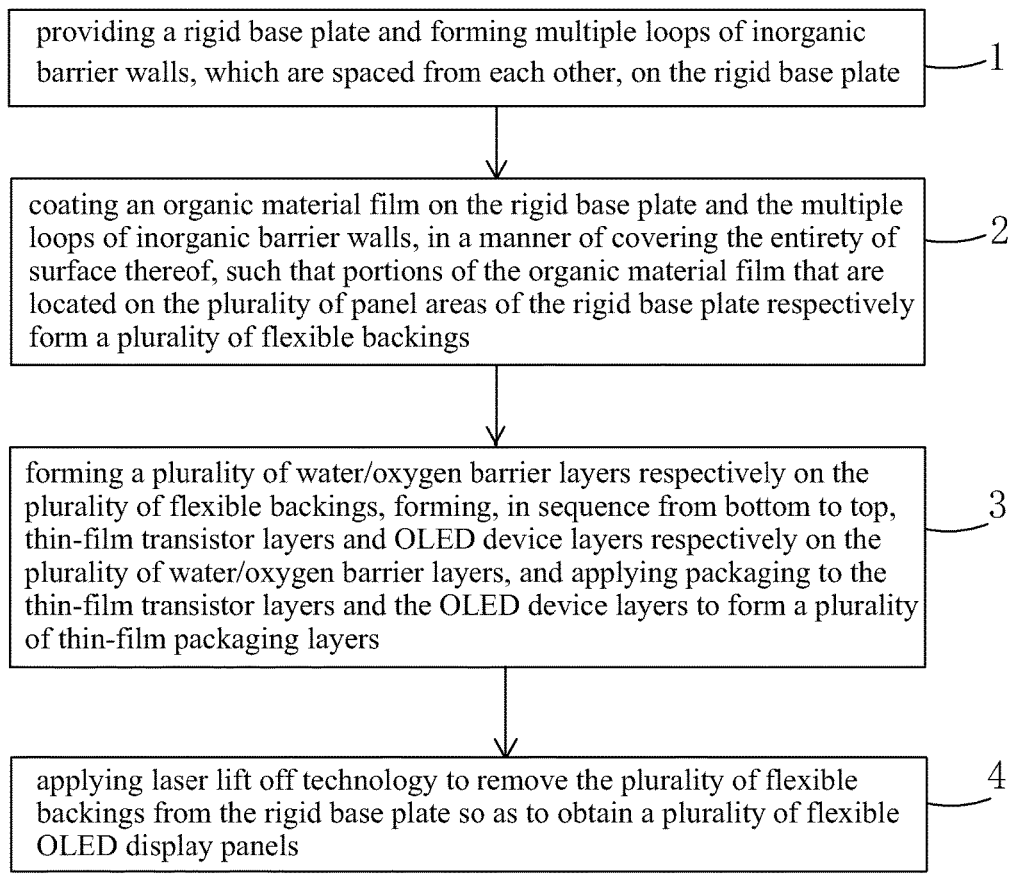
FIG. 1 is a flow chart illustrating a manufacturing method of a flexible OLED display panel according to the present invention.
Figure 2:
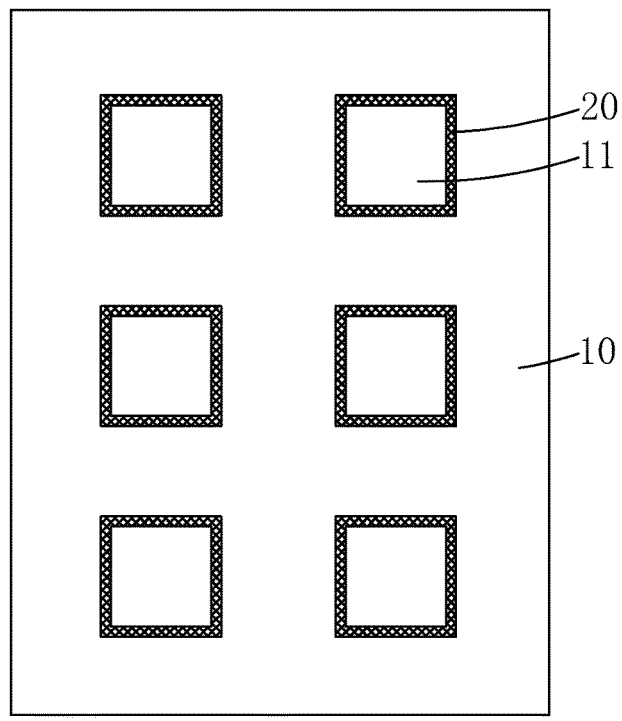
FIGS. 2-3 are schematic views illustrating Step 1 of the manufacturing method of the flexible OLED display panel according to the present invention.
Figure 3:
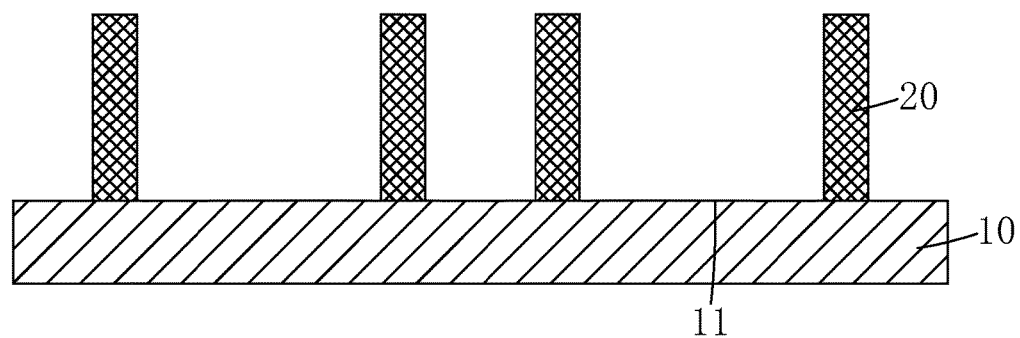

Referring to FIG. 1, the present invention provides a manufacturing method of a flexible OLED display panel, which comprises the following steps:

Step 1: as shown in FIGS. 2 and 3, providing a rigid base plate 10 and forming multiple loops of inorganic barrier walls 20, which are spaced from each other, on the rigid base plate 10 such that the multiple loops of inorganic barrier walls 20 respectively and circumferentially enclose a plurality of panel areas 11 on the rigid base plate 10.

Specifically, the rigid base plate 10 comprises a glass plate.

Specifically, the multiple loops of inorganic barrier walls 20 are formed of a material comprising at least one of silicon oxide ($SiO_x$), silicon nitride ($SiN_x$), and silicon oxynitride ($SiO_xN_x$).

Preferably, the multiple loops of inorganic barrier walls 20 are formed of a material comprising silicon oxide in order to be consistent with a material of glass plate to ensure excellent adhesion between the inorganic barrier walls 20 and the rigid base plate 10. In this situation, a manufacturing process of the multiple loops of inorganic barrier walls 20 may include: providing frit, wherein the frit comprises silicon oxide and a solvent, and applying a screen printing operation to coat multiple loops of frit on the rigid base plate 10, followed by heating and curing to form the multiple loops of inorganic barrier walls 20.

Figure 4:
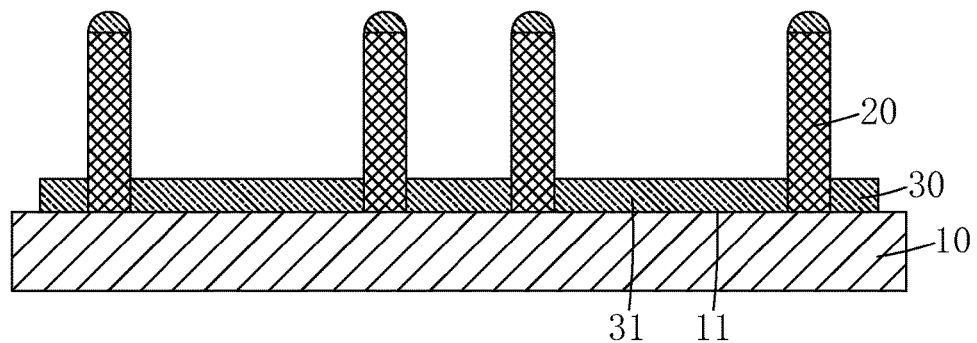
FIG. 4 is a schematic view illustrating Step 2 of the manufacturing method of the flexible OLED display panel according to the present invention.

Step 2: as shown in FIG. 4, coating an organic material film 30 on the rigid base plate 10 and the multiple loops of inorganic barrier walls 20, in a manner of covering the entirety of surface thereof, such that as being separated by the multiple loops of inorganic barrier walls 20, portions of the organic material film 30 that are located on the plurality of panel areas 11 of the rigid base plate 10 respectively form a plurality of flexible backings 31.

Specifically, in Step 2, the organic material film 30 comprises a polyimide (PI) film.

Specifically, the flexible backings 31 have a thickness smaller than a height of the inorganic barrier walls 20.

Figure 5:
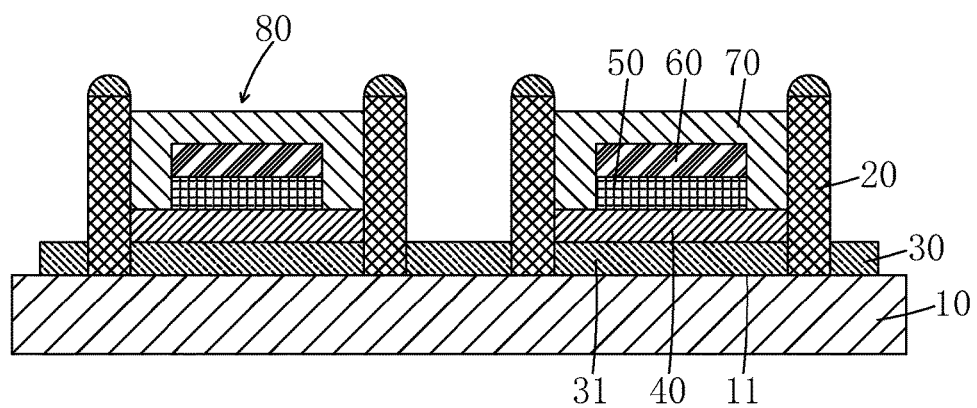
FIG. 5 is a schematic view illustrating Step 3 of the manufacturing method of the flexible OLED display panel according to the present invention.

Step 3: as shown in FIG. 5, forming a plurality of water/oxygen barrier layers 40 respectively on the plurality of flexible backings 31, forming, in sequence from bottom to top, thin-film transistor layers 50 and OLED device layers 60 respectively on the plurality of water/oxygen barrier layers 40, and applying packaging to the thin-film transistor layers 50 and the OLED device layers 60 to form a plurality of thin-film packaging layers 70 respectively on the OLED device layers 60 and the water/oxygen barrier layers 40 such that each of the thin-film packaging layers 70 encloses the OLED device layer 60 and the thin-film transistor layer 50 located thereunder to thereby form a plurality of flexible OLED display panels 80, which are respectively located in the multiple loops of inorganic barrier walls 20, on the rigid base plate 10.

Specifically, the water/oxygen barrier layers 40 and the thin-film packaging layers 70 provide protection to upper and lower sides of the OLED device layer 60 and the thin-film transistor layer 50 in order to effectively prevent invasion of external moisture and oxygen.

Specifically, the water/oxygen barrier layers 40 have a surface are that is less than or substantially equal to a surface area of the flexible backings 31 and is also greater than a surface area of the OLED device layers 60 and the thin-film transistor layers 50 so as to ensure the water/oxygen barrier layers 40 may completely cover the OLED device layers 60 and the thin-film transistor layers 50 to provide effective protection thereto.

Figure 6:
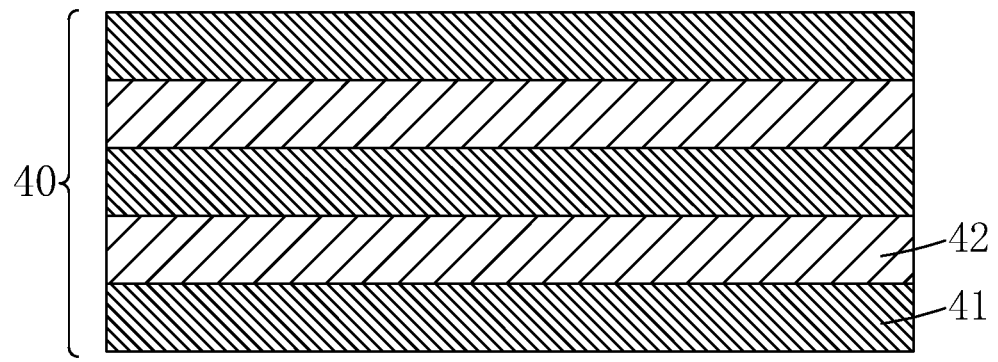
FIG. 6 is a schematic view illustrating a water/oxygen barrier layer formed in Step 3 of the manufacturing method of the flexible OLED display panel according to the present invention.
Figure 7:
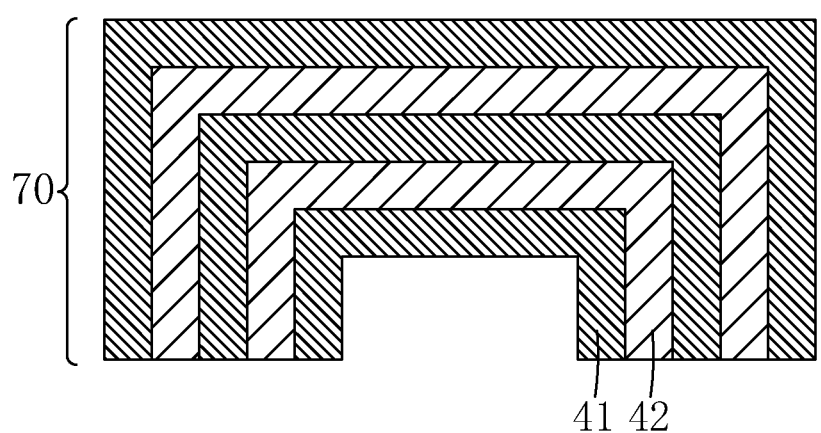
FIG. 7 is a schematic view illustrating a thin-film packaging layer formed in Step 3 of the manufacturing method of the flexible OLED display panel according to the present invention.

Specifically, as shown in FIGS. 6 and 7, the water/oxygen barrier layers 40 and the thin-film packaging layers 70 each comprise a plurality of inorganic material layers 41 and organic material layers 42 that are arranged to stack on and alternate with each other.

The inorganic material layers 41 are formed of a material comprising at least one of silicon oxide ($SiO_x$), silicon nitride ($SiN_x$), and silicon oxynitride ($SiO_xN_x$); and the organic material layers 42 are formed of a material comprising one or multiple ones of acrylic, hexamethyldisiloxane (HMDSO), polyacrylate, polycarbonate, and polystyrene.

Figure 8:
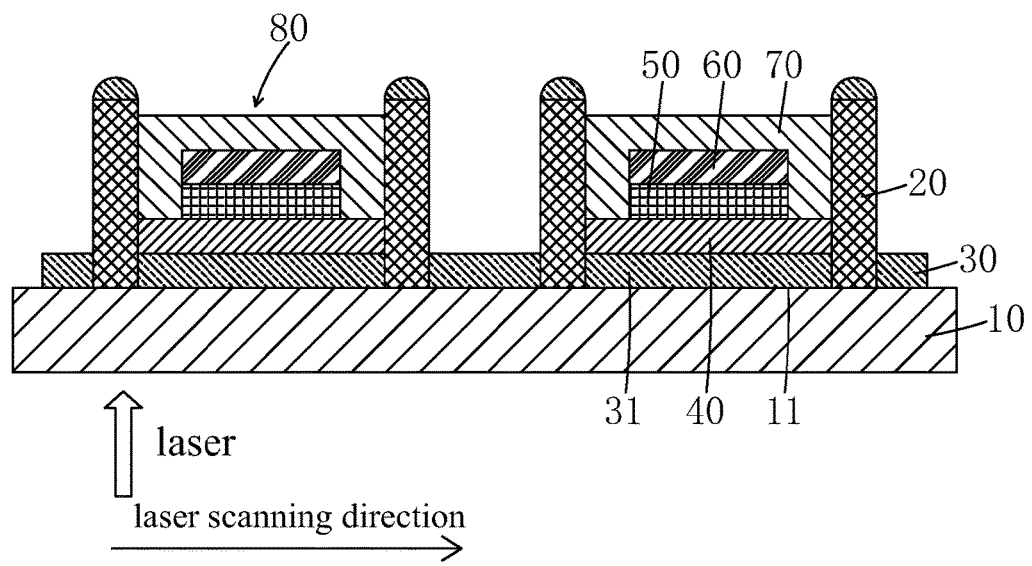
FIG. 8 is a schematic view illustrating Step 4 of the manufacturing method of the flexible OLED display panel according to the present invention.

Step 4: as shown in FIG. 8, applying laser lift off (LLO) technology to remove the plurality of flexible backings 31 from the rigid base plate 10 so as to obtain a plurality of flexible OLED display panels 80.

Figure 9:
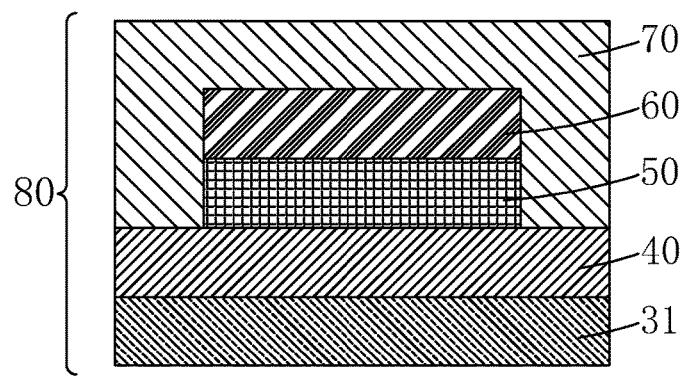
FIG. 9 is a schematic view illustrating the structure of a flexible OLED display panel formed in Step 4 of the manufacturing method of the flexible OLED display panel according to the present invention.

Specifically, as shown in FIG. 9, the flexible OLED display panels 80 each comprise a flexible backing 31; a water/oxygen barrier layer 40, a thin-film transistor layer 50, and an OLED device layer 60 stacked, in sequence from bottom to top, on the flexible backing 31; and a thin-film packaging layer 70 arranged on the OLED device layer 60 and the water/oxygen barrier layer 40, wherein the thin-film packaging layer 70 encloses the OLED device layer 60 and the thin-film transistor layer 50 located thereunder.

In summary, the present invention provides a manufacturing method of a flexible OLED display panel, in which multiple loops of inorganic barrier walls are first formed on a rigid base plate such that the multiple loops of inorganic barrier walls respectively and circumferentially encloses a plurality of panel areas on the rigid base plate so that when an organic material film is then coated on the rigid base plate and the multiple loops of inorganic barrier walls in a manner of covering the entirety of surface thereof, the multiple loops of inorganic barrier walls provide an effect of division to allow a plurality of flexible backings to be respectively formed on the plurality of panel areas of the rigid base plate. Afterwards, a laser lift off technique is applied to remove the plurality of flexible backings from the rigid base plate to thus obtain a plurality of flexible OLED display panels. Compared to the prior art, the present invention saves a process of using a laser cutting machine to simultaneously cut the organic material film and the rigid base plate and thus saves the cost of purchasing the laser cutting machine and also save one round of laser cutting operation to thereby reduce the manufacturing cost of a flexible OLED display panel.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A manufacturing method of a flexible organic light emitting display (OLED) display panel, comprising the following steps:
   Step 1: providing a rigid base plate and forming multiple loops of inorganic barrier walls, which are spaced from each other, on the rigid base plate such that the multiple loops of inorganic barrier walls respectively and circumferentially enclose a plurality of panel areas on the rigid base plate;
   Step 2: coating an organic material film on the rigid base plate and the multiple loops of inorganic barrier walls, in a manner of covering the entirety of surface thereof, such that as being separated by the multiple loops of inorganic barrier walls, portions of the organic material film that are located on the plurality of panel areas of the rigid base plate respectively form a plurality of flexible backings;

Step 3: forming a plurality of water/oxygen barrier layers respectively on the plurality of flexible backings, forming, in sequence from bottom to top, thin-film transistor layers and OLED device layers respectively on the plurality of water/oxygen barrier layers, and applying packaging to the thin-film transistor layers and the OLED device layers to form a plurality of thin-film packaging layers respectively on the OLED device layers and the water/oxygen barrier layers such that each of the thin-film packaging layers encloses the OLED device layer and the thin-film transistor layer located thereunder to thereby form a plurality of flexible OLED display panels, which are respectively located in the multiple loops of inorganic barrier walls, on the rigid base plate; and Step 4: applying laser lift off (LLO) technology to remove the plurality of flexible backings from the rigid base plate so as to obtain a plurality of flexible OLED display panels.

2. The manufacturing method of the flexible OLED display panel as claimed in claim 1, wherein the rigid base plate comprises a glass plate.

3. The manufacturing method of the flexible OLED display panel as claimed in claim 1, wherein the multiple loops of inorganic barrier walls are formed of a material comprising at least one of silicon oxide, silicon nitride, and silicon oxynitride.

4. The manufacturing method of the flexible OLED display panel as claimed in claim 3, wherein the material of the multiple loops of inorganic barrier walls is silicon oxide, and the multiple loops of inorganic barrier walls are formed with a process including: providing frit, wherein the frit comprises silicon oxide and a solvent, and applying screen printing to coat multiple loops of frit on the rigid base plate, followed by heating and curing to form the multiple loops of inorganic barrier walls.

5. The manufacturing method of the flexible OLED display panel as claimed in claim 1, wherein in Step 2, the organic material film comprises a polyimide film.

6. The manufacturing method of the flexible OLED display panel as claimed in claim 1, wherein the flexible backings have a thickness that is less than a height of the inorganic barrier walls.

7. The manufacturing method of the flexible OLED display panel as claimed in claim 1, wherein the water/oxygen barrier layers each have a surface area that is smaller than or substantially equal to a surface area of the flexible backings and also greater than a surface area of the OLED device layers and the thin-film transistor layers.

8. The manufacturing method of the flexible OLED display panel as claimed in claim 1, wherein the water/oxygen barrier layers and the thin-film packaging layers each comprise a plurality of inorganic material layers and organic material layers arranged to stack on and alternate with each other.

9. The manufacturing method of the flexible OLED display panel as claimed in claim 8, wherein the inorganic material layers are formed of a material comprising at least one of silicon oxide, silicon nitride, and silicon oxynitride; and the organic material layers are formed of a material comprising one or multiple ones of acrylic, hexamethyldisiloxane, polyacrylate, polycarbonate, and polystyrene.

10. The manufacturing method of the flexible OLED display panel as claimed in claim 1, wherein the flexible OLED display panels each comprise: the flexible backing; the water/oxygen barrier layer, the thin-film transistor layer, and the OLED device layer that are stacked, in sequence from bottom to top, on the flexible backing; and a thin-film packaging layer arranged on the OLED device layer and the water/oxygen barrier layer, wherein the thin-film packaging layer encloses the OLED device layer and the thin-film transistor layer located thereunder.

11. A manufacturing method of a flexible organic light emitting display (OLED) panel, comprising the following steps:

Step 1: providing a rigid base plate and forming multiple loops of inorganic barrier walls, which are spaced from each other, on the rigid base plate such that the multiple loops of inorganic barrier walls respectively and circumferentially enclose a plurality of panel areas on the rigid base plate;

Step 2: coating an organic material film on the rigid base plate and the multiple loops of inorganic barrier walls, in a manner of covering the entirety of surface thereof, such that as being separated by the multiple loops of inorganic barrier walls, portions of the organic material film that are located on the plurality of panel areas of the rigid base plate respectively form a plurality of flexible backings;

Step 3: forming a plurality of water/oxygen barrier layers respectively on the plurality of flexible backings, forming, in sequence from bottom to top, thin-film transistor layers and OLED device layers respectively on the plurality of water/oxygen barrier layers, and applying packaging to the thin-film transistor layers and the OLED device layers to form a plurality of thin-film packaging layers respectively on the OLED device layers and the water/oxygen barrier layers such that each of the thin-film packaging layers encloses the OLED device layer and the thin-film transistor layer located thereunder to thereby form a plurality of flexible OLED display panels, which are respectively located in the multiple loops of inorganic barrier walls, on the rigid base plate; and Step 4: applying laser lift off (LLO) technology to remove the plurality of flexible backings from the rigid base plate so as to obtain a plurality of flexible OLED display panels;

wherein the rigid base plate comprises a glass plate; and wherein in Step 2, the organic material film comprises a polyimide film.

12. The manufacturing method of the flexible OLED display panel as claimed in claim 11, wherein the multiple loops of inorganic barrier walls are formed of a material comprising at least one of silicon oxide, silicon nitride, and silicon oxynitride.

13. The manufacturing method of the flexible OLED display panel as claimed in claim 12, wherein the material of the multiple loops of inorganic barrier walls is silicon oxide, and the multiple loops of inorganic barrier walls are formed with a process including: providing frit, wherein the frit comprises silicon oxide and a solvent, and applying screen printing to coat multiple loops of frit on the rigid base plate, followed by heating and curing to form the multiple loops of inorganic barrier walls.

14. The manufacturing method of the flexible OLED display panel as claimed in claim 11, wherein the flexible backings have a thickness that is less than a height of the inorganic barrier walls.

15. The manufacturing method of the flexible OLED display panel as claimed in claim 11, wherein the water/ oxygen barrier layers each have a surface area that is smaller than or substantially equal to a surface area of the flexible backings and also greater than a surface area of the OLED device layers and the thin-film transistor layers.

16. The manufacturing method of the flexible OLED display panel as claimed in claim 11, wherein the water/oxygen barrier layers and the thin-film packaging layers each comprise a plurality of inorganic material layers and organic material layers arranged to stack on and alternate with each other.

17. The manufacturing method of the flexible OLED display panel as claimed in claim 16, wherein the inorganic material layers are formed of a material comprising at least one of silicon oxide, silicon nitride, and silicon oxynitride; and the organic material layers are formed of a material comprising one or multiple ones of acrylic, hexamethyldisiloxane, polyacrylate, polycarbonate, and polystyrene.

18. The manufacturing method of the flexible OLED display panel as claimed in claim 11, wherein the flexible OLED display panels each comprise: the flexible backing; the water/oxygen barrier layer, the thin-film transistor layer, and the OLED device layer that are stacked, in sequence from bottom to top, on the flexible backing; and a thin-film packaging layer arranged on the OLED device layer and the water/oxygen barrier layer, wherein the thin-film packaging layer encloses the OLED device layer and the thin-film transistor layer located thereunder.

* * * * *